(12) United States Patent
Yang et al.

(10) Patent No.: US 6,972,248 B2
(45) Date of Patent: Dec. 6, 2005

(54) METHOD OF FABRICATING SEMICONDUCTOR DEVICE

(75) Inventors: Sweehan J. H. Yang, Tainan (TW); Kuo-Chien Wu, Miaoli (TW); Shih-Fan Kuan, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/709,591

(22) Filed: May 17, 2004

(65) Prior Publication Data

US 2005/0202666 A1   Sep. 15, 2005

(30) Foreign Application Priority Data

Mar. 10, 2004   (TW) ............................... 93106283 A

(51) Int. Cl.[7] ............................................. H01L 21/44
(52) U.S. Cl. ...................................................... 438/597
(58) Field of Search ................................ 438/597, 583, 438/387, 303, 257, 240, 221, 22; 257/616, 257/500, 381, 306, 66

(56) References Cited

U.S. PATENT DOCUMENTS 6,661,051 B1 * 12/2003 Durcan et al. ............... 257/306

* cited by examiner

*Primary Examiner*—Craig A. Thompson
*Assistant Examiner*—Monica D Harrison
(74) *Attorney, Agent, or Firm*—Jianq Chyun IP Office

(57) ABSTRACT

A method of fabricating a semiconductor device. A stack gate structure having a cap layer thereon and a first dielectric layer having a top surface that exposes the cap layer are formed on a substrate. A buffer layer is formed to cover the dielectric layer and the cap layers in a first region of the substrate. A portion of the cap layers in a second region of the substrate are removed so that the cap layers have a thickness smaller than or equal to the buffer layer. A second dielectric layer is formed over the substrate. A portion of the second dielectric layer and the underlying the buffer layer and the first dielectric layer are etched to form a bit line contact opening. In the meantime, a portion of the second dielectric layer and the underlying cap layer are etched to form a gate contact opening.

19 Claims, 3 Drawing Sheets

METHOD OF FABRICATING SEMICONDUCTOR DEVICE

CROSS REFERENCE TO RELATED APPLICATIONS

This application claims the priority benefit of Taiwan application serial no. 93106283, filed Mar. 10, 2004.

BACKGROUND OF INVENTION

1. Field of the Invention

The present invention relates to a method of fabricating an integrated circuit. More particularly, the present invention relates to a method of fabricating a semiconductor device capable of preventing the problem of having some photoresist residue retained after photoresist development due to non-complete exposure of a photoresist layer with a high aspect ratio.

2. Description of the Related Art

In the fabrication of an integrated circuit, the source/drain region or gate of a device is electrically connected to another device through a contact and a conductive line. The most common types of contacts include bit line contacts and gate contacts. At present, these two types of contacts are formed separately due to processing limitations. In other words, two independent photolithographic/etching processes are carried out in sequence to form the bit line contacts and the gate contacts respectively.

In a conventional fabrication process, an etching operation is carried out using a photoresist layer having bit line contact opening and gate contact opening patterns. The etching operation removes a portion of the dielectric layer so that a bit line contact opening that exposes a portion of the source/drain region in the substrate and a semi-finished gate contact opening that exposes a portion of the cap layer in a stack gate structure are formed. In general, the cap layer is normally a silicon nitride layer having a thickness of several hundred angstroms. Therefore, if the aforementioned patterned photoresist layer is used as a photomask for etching the cap layer, the exposed substrate within the bit line contact opening is likely to be over-etched and damaged because silicon and silicon nitride have not significantly different etching rates. To prevent over-etching, the aforementioned patterned photoresist layer is used as an etching mask to remove the dielectric layer over the source/drain region and form the bit line contact openings. Thereafter, a second patterned photoresist layer having openings that exposes the cap layers of the stack gate structures only is formed over the substrate. Finally, the cap layers are removed to form the gate contact openings by performing an etching operation using the second patterned photoresist layer as an etching mask.

However, in the first etching operation to form the bit line contact, considerable length of time is still required to expose the source/drain region in the substrate. Therefore, if there is some misalignment in the etching process, the cap layer and the spacers lining the sidewall of the stack gate structure may be damaged causing the gate conductive layer to expose. Eventually, the gate conductive layer will form a short circuit with a subsequently formed bit line contact plug.

On the other hand, because the a semi-finished gate contact opening has already formed on the substrate, some photoresist material will also fill the semi-finished gate contact opening when the second photoresist layer is formed over the substrate. Since the semi-finished gate contact opening has a high aspect ratio, the photoresist material near the bottom section of the semi-finished gate contact opening is difficult to get exposed. Hence, some residual photoresist may be retained on the cap layer to prevent a clean removal of the cap layer in a subsequent etching operation. In the presence of some residue, the contact resistance of the contacts will have significant variations.

SUMMARY OF INVENTION

Accordingly, at least one objective of the present invention is to provide a method of fabricating a semiconductor device capable of preventing the problem of having some photoresist residue retained after photoresist development due to non-complete exposure of a photoresist layer with a high aspect ratio.

At least a second objective of the present invention is to provide a method of fabricating a semiconductor device capable of preventing a gate conductive layer from shorting with a bit line contact plug inside the semiconductor device.

To achieve these and other advantages and in accordance with the purpose of the invention, as embodied and broadly described herein, the invention provides a method of fabricating a semiconductor device. First, a substrate is provided. A stack gate structure having a cap layer thereon is formed on the substrate and then a spacer is formed on each side of the stack gate structure. A first dielectric layer having a top surface that exposes the cap layer is formed over the substrate. A buffer layer is formed to cover the dielectric layer and the cap layers in a first region of the substrate so that the first dielectric layer and the cap layers in a second region of the substrate is exposed. A portion of the cap layers in the second region of the substrate are removed so that the cap layers have a thickness smaller than or equal to the buffer layer. A second dielectric layer and a mask layer are sequentially formed over the substrate. The mask layer has a first opening for defining a bit contact opening and a second opening for defining a gate contact opening. The second dielectric layer within the first opening and the underlying buffer layer and the first dielectric layer are etched in sequence to form a bit line contact opening. In the meantime, the second dielectric layer within the second opening and the underlying cap layer are etched in sequence to form a gate contact opening.

According to one preferred embodiment of the present invention, the buffer layer and the cap layer are fabricated using an identical material. Furthermore, the buffer layer and the cap layer have an etching rate different from the second dielectric layer and the first dielectric layer. The buffer layer and the cap layer are silicon nitride layers, for example.

Because the buffer layer is fabricated using a material having an etching rate that differs from the second dielectric layer and the first dielectric layer, a three-stage etching process can be carried out to form the first contact opening through an adjustment of the gaseous reactants. The first stage etching operation is carried out using the buffer layer and the cap layer as an etching stop layer. The second stage etching operation is carried out using the first dielectric layer as an etching stop layer. Finally, the third stage etching operation is carried out for a short period of time so that the cap layer and the spacers will not be too seriously damage to expose the gate conductive layer even if there is some misalignment.

The process of forming a buffer layer over the first dielectric layer and the cap layer in the first region of the substrate so that the exposed cap layers in the second region can have a thickness smaller than or equal to the buffer layer includes the following steps. First, a buffer layer is formed over the substrate. Thereafter, a photoresist layer is formed over the buffer layer. The photoresist layer covers the first dielectric layer and surrounding cap layer for forming the first contact openings. Using the photoresist layer as an etching mask, a portion of the buffer layer is removed to expose the cap layers and then the cap layers are etched until the cap layers have a thickness smaller than or equal to the buffer layer.

In process of etching out the contact openings according to the present invention, the cap layer within the second opening in the mask layer has a thickness smaller than or equal to the buffer layer. Thus, the process of removing the buffer layer in an etching operation also removes the cap layers entirely. In other words, there is no need to form an extra photoresist layer just to remove the cap layer and prevents the problems of having residues after photoresist development due to unexposed photoresist at the bottom of a photoresist layer when the aspect ratio is high.

According to one embodiment of the present invention, the process of fabricating the cap layer and the buffer layer can also be so controlled that the buffer layer is thicker than the cap layer. This also ensures the cap layers within the second opening in the mask layer can be completely removed after the etching process.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
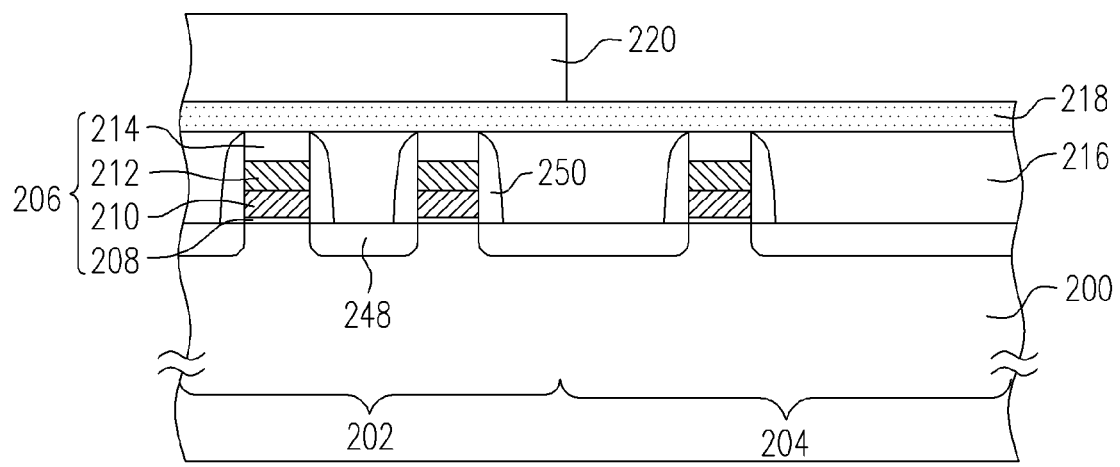
FIGS. 1A through 1E are schematic cross-sectional views showing the steps for fabricating a semiconductor device according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic cross-sectional views showing the steps for fabricating a semiconductor device according to one preferred embodiment of the present invention. First, as shown in FIG. 1A, a substrate 200 having a first region 202 and a second region 204 is provided. The first region 202 is an area around a memory cell region for forming bit line contacts and the second region 204 is an area around a memory cell region for forming gate contacts and an area for forming peripheral circuits, for example. Thereafter, a plurality of stack gate structures 206 is formed within the first region 202 and the second region 204. The stack gate structures 206 comprises a gate dielectric layer 208 next to the substrate, a pair of gate conductive layers 210, 212 in the middle and a cap layer 214 at the top. The gate dielectric layer 208 is a silicon oxide layer, the gate conductive layers 210, 212 are polysilicon or metal silicide layers and the cap layer 214 is a silicon nitride layer, for example. Next, a source/drain region 248 is formed in the substrate 200, for example, by performing an ion implantation process. Afterwards, spacers 250 are formed on the sidewalls of the stack gate structures 206. The spacers 250 are silicon nitride layers formed, for example, by depositing silicon nitride over the substrate and etching back the silicon nitride layer thereafter.

A dielectric layer 216 is formed over the substrate 200. The top surface of the dielectric layer 216 exposes the cap layers 214 of the stack gate structures 206. The dielectric layer 216 is formed, for example, by depositing dielectric material such as borophosphosilicate glass or silicon oxide over the substrate 200 and then performing a chemical-mechanical polishing using the cap layer 214 as a polishing stop layer.

A buffer layer 218 is formed over the substrate 200 to cover the dielectric layer 216 and the cap layers 214. The buffer layer 218 is fabricated using a material having an etching rate that differs from the dielectric layer 216 and a subsequently formed dielectric layer 222 (shown in FIG. 1C) such as silicon nitride. Thereafter, a mask layer 220 is formed over the buffer layer 218 to cover the first region 202 but exposes the buffer layer 218 in the second region 204. The mask layer 220 is a photoresist layer, for example. Furthermore, the mask layer 220 may integrate with the photoresist layer used for opening up alignment marks. In other words, the mask layer 220 may include an opening pattern within the second region 204 and an opening pattern (not shown) for opening up alignment marks.

Figure 1B:
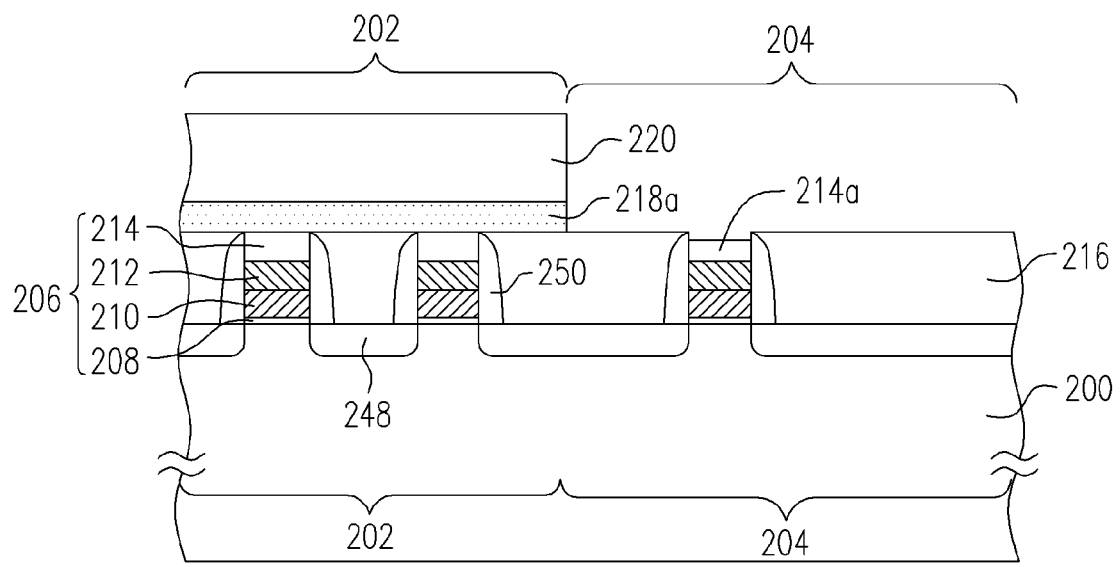

As shown in FIG. 1B, an etching operation is carried out to remove a portion of the buffer layer 218 in the second region 204 and a portion of the exposed cap layer 214 within the second region 204. After the etching operation, a buffer layer 218a and cap layers 214a are formed such that the cap layers 214a in the second region 204 have a thickness smaller than or equal to a buffer layer 218a in the first region 202. If the cap layers 214 are specifically made to have a thickness smaller than or equal to the buffer layer 218 during the fabrication process, there is no need to etch the cap layer 214 after the buffer layer 218 in the second region 204 has been removed. Thereafter, the mask layer 220 is removed.

Figure 1C:
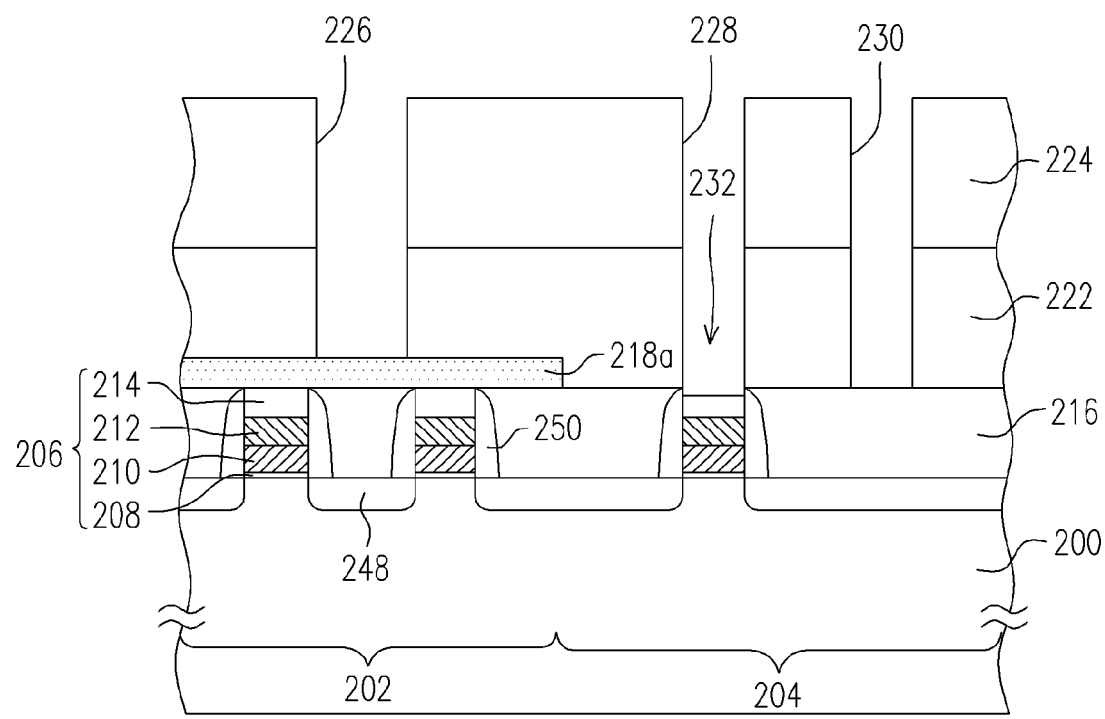

As shown in FIG. 1C, another dielectric layer 222 such as a silicon oxide layer is formed over the substrate 200. Thereafter, a mask layer 224 is formed over the dielectric layer 222. The mask layer 224 is a photoresist layer having openings 226, 228 and 230 therein, for example. The opening 226 is formed within the first region 202 above the source/drain region 248 in the first region 202. The opening 228 is formed in a memory cell area within the second region 204 above the cap layer 214a of the stack gate structure 206, for example. The opening 230 is formed within the second region 204 above a source/drain region 248 of a peripheral memory cell, for example.

Thereafter, an etching operation is carried out inside an etching station to remove the dielectric layer 222 within the openings 226, 228 and 230 in the mask layer 224. After the etching operation, the opening 226 exposes the buffer layer 218a in the first region 202, the opening 228 exposes the cap layers 214a in the second region 204 and the opening 230 exposes the dielectric layer 216. If the dielectric layer 222 is a silicon oxide layer, the gaseous reactants used in the etching operation include $C_4F_6$, $O_2$ and Ar.

Figure 1D:
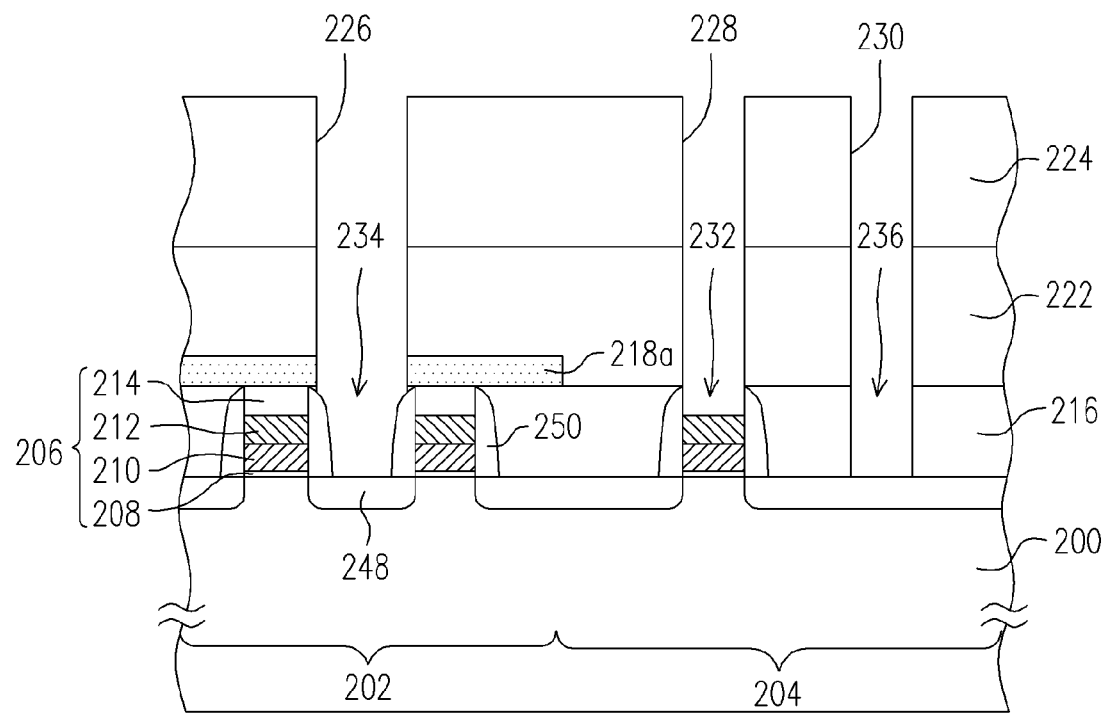

As shown in FIG. 1D, using the same etching station, the buffer layer 218a within the opening 226 is removed to expose a portion of the dielectric layer 216 and the cap layer 214a within the opening 228 are removed to form a gate contact opening 232. If both the buffer layer 218a and the cap layers 214a are silicon nitride layers, the gaseous reactants used in the etching operation include $CF_4$, $CHF_3$, $O_2$ and Ar. Because the cap layers 214a have a thickness smaller than or equal to the buffer layer 218a, complete removal of the cap layers 214a is ensured when the buffer layer 218a is completely removed.

Thereafter, the etching operation is continued inside the same etching station to remove the dielectric layer 216 within the openings 226, 230 and form contact openings 234, 236 respectively. The contact opening 234 is a bit line contact opening that exposes one of the source/drain regions 248 and the contact opening 236 is a contact opening that exposes one of the source/drain regions 248 in a peripheral circuit region, for example. The gaseous reactants used in the etching operation include $C_4F_6$, $O_2$ and Ar.

Figure 1E:
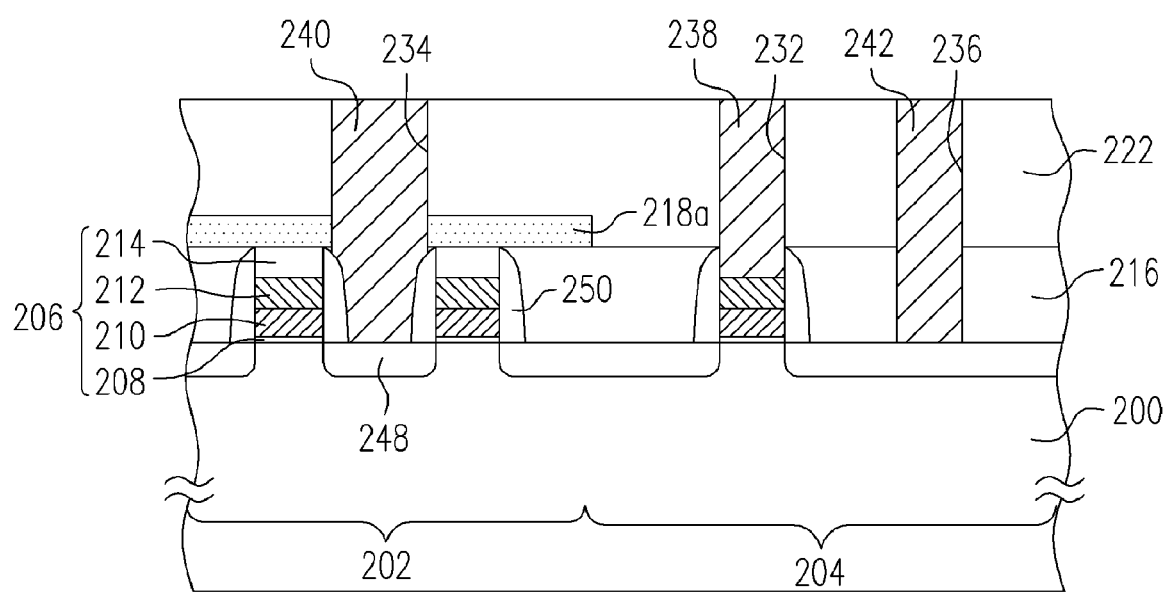

As shown in FIG. 1E, the mask layer 224 is removed. Thereafter, conductive material is deposited into the contact openings 232, 234, 236 to form contact plugs 238, 240, 242 respectively.

Because the buffer layer is fabricated using a material having an etching rate that differs from its overlying and underlying dielectric layer, the contact openings are formed by performing the etching operation in three separate stages through an adjustment of the composition of gaseous reactants. In the first stage, the second dielectric layer is etched using the buffer layer and the cap layer as an etching stop layer. In the second stage, the buffer layer and the cap layer are etched using the first dielectric layer as an etching stop layer. Finally, in the third stage, the first dielectric layer is etched for a short period of time. Hence, the cap layer and the spacers will not be too seriously damage to expose the gate conductive layer even if there is some misalignment.

In process of etching out the contact openings according to the present invention, the cap layer within the second opening of the mask layer has a thickness smaller than or equal to the buffer layer. Thus, the process of removing the buffer layer in an etching operation also removes the cap layers completely. In other words, there is no need to form an extra photoresist layer just to remove the cap layer and prevents the problems of having residues after photoresist development due to unexposed photoresist at the bottom of a photoresist layer when the aspect ratio is high. Furthermore, the present invention also has a greater processing window than the conventional fabrication process.

According to one embodiment of the present invention, the process of fabricating the cap layer and the buffer layer can also be so controlled that the buffer layer is thicker than the cap layer. This also ensures the cap layers within the second opening in the mask layer can be completely removed after the etching process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a semiconductor device, comprising the steps of:
   providing a substrate having a first region and a second region;
   forming a plurality of stack gate structures on the first region and the second region of the substrate, wherein each stack gate structure comprises a gate dielectric layer a gate dielectric layer next to the substrate, a gate conductive layer in the middle and a cap layer on top;
   forming a spacer on each side of the stack gate structure;
   forming a plurality of conductive regions in the substrate between the stack gate structures;
   forming a first dielectric layer over the substrate, wherein the top surface of the first dielectric layer exposes the cap layers;
   forming a buffer layer over the substrate within the first region to cover the first dielectric layer and the cap layers;
   removing a portion of the cap layers of the stack gate structure within the second region so that the cap layers within the second region have a thickness smaller than or equal to the buffer layer;
   forming a second dielectric layer over the first region and the second region of the substrate;
   forming a first mask layer over the second dielectric layer, wherein the first mask layer having:
   a plurality of first openings within the first region formed above various conductive regions; and
   a plurality of second openings with the second region formed above various cap layers of the stack gate structures;
   removing the second dielectric layer and its underlying buffer layer as well as cap layers within the first opening and the first dielectric layer within the second openings to form a plurality of first contact openings and a plurality of second contact openings respectively, wherein the first contact openings expose various conductive regions within the first region and the second contact openings expose various gate conductive layers of the stack gate structures within the second region; and
   removing the first mask layer.

2. The method of claim 1, wherein the buffer layer and the cap layer are fabricated using an identical material, and furthermore, has an etching rate different from the second dielectric layer and the first dielectric layer.

3. The method of claim 2, wherein the step of forming the first contact openings and the second contact openings further comprises:
   performing a first etching operation to remove the second dielectric layer within the first openings and the second openings so that the first openings expose the buffer layer and the second openings expose the cap layers;
   performing a second etching operation to remove the buffer layer within the first opening and the cap layer within the second openings so that the first openings expose the first dielectric layer and the second openings expose the gate conductive layer of the stack gate structures in the second region to form the second contact openings; and
   performing a third etching operation to remove the first dielectric layer within the first openings to form the first contact openings.

4. The method of claim 3, wherein the first etching operation, the second etching operation and the third etching operation are all carried out inside the reaction chamber of a processing station.

5. The method of claim 4, wherein material constituting the buffer layer and the cap layer comprises silicon nitride formed using gaseous reactants $CF_4$, $CHF_3$, $O_2$ and Ar.

6. The method of claim 2, wherein the first mask layer further comprises a plurality of third openings within the second region above some of the conductive regions, and the step of removing the second dielectric layer and its underlying buffer layer and cap layer within the first openings and the first dielectric layer within the second openings comprises:

removing the second dielectric layer and its underlying first dielectric layer within the third openings to form the third contact openings.

7. The method of claim 6, wherein the step of forming the first contact openings, the second contact openings and the third contact openings further comprises:

performing a first etching operation to remove the second dielectric layer within the first openings, the second openings and the third openings so that the first openings expose the buffer layer, the second openings expose the cap layer and the third openings expose the first dielectric layer;

performing a second etching operation to remove the buffer layer within the first openings and the cap layer within the second openings so that the first openings expose the first dielectric layer and the second openings expose the gate conductive layer of the stack gate structures in the second region to form the second contact openings; and performing a third etching operation to remove the first dielectric layer within the first openings and the third openings to form the second contact openings and the third contact openings.

8. The method of claim 7, wherein the first etching operation, the second etching operation and the third etching operation are all carried out within the reaction chamber of a processing station.

9. The method of claim 8, wherein material constituting the buffer layer and the cap layers comprises silicon nitride formed using gaseous reactants $CH_4$, $CHF_3$, $O_2$ and Ar.

10. The method of claim 2, wherein the step of forming the buffer layer over the first region of the substrate and removing a portion of the cap layer of the stack gate structures in the second region further comprises:

forming a buffer material layer over the substrate to cover the first dielectric layer and the cap layers;

forming a second mask layer over the material buffer layer within the first region so that the buffer material layer in the second region is exposed; and removing the buffer material layer in the second region and removing a portion of the cap layers of the stack gate structures in the second region so that the remaining cap layers in the second region have a thickness smaller than or equal to the buffer material layer.

11. A method of fabricating a semiconductor device, comprising the steps of:

providing a substrate having a first region and a second region;

forming a plurality of stack gate structures on the first region and the second region of the substrate, wherein each stack gate structure comprises a gate dielectric layer a gate dielectric layer next to the substrate, a gate conductive layer in the middle and a cap layer on top;

forming a spacer on each side of the stack gate structure;

forming a plurality of conductive regions in the substrate between the stack gate structures;

forming a first dielectric layer over the substrate, wherein the top surface of the first dielectric layer exposes the cap layers;

forming a buffer layer over the substrate within the first region to cover the first dielectric layer and the cap layers, wherein the buffer layer has a thickness greater than or equal to the cap layers;

forming a second dielectric layer over the first region and the second region of the substrate;

forming a first mask layer over the second dielectric layer, wherein the first mask layer having:

a plurality of first openings within the first region formed above various conductive regions; and a plurality of second openings with the second region formed above various cap layers of the stack gate structures;

removing the second dielectric layer and its underlying buffer layer as well as cap layers within the first opening and the first dielectric layer within the second openings to form a plurality of first contact openings and a plurality of second contact openings respectively, wherein the first contact openings expose various conductive regions within first region and the second contact openings expose various gate conductive layers of the stack gate structures; and removing the first mask layer.

12. The method of claim 11, wherein the buffer layer and the cap layer are fabricated using an identical material, and furthermore, has an etching rate different from the second dielectric layer and the first dielectric layer.

13. The method of claim 12, wherein the step of forming the first contact openings and the second contact openings further comprises:

performing a first etching operation to remove the second dielectric layer within the first openings and the second openings so that the first openings expose the buffer layer and the second openings expose the cap layers;

performing a second etching operation to remove the buffer layer within the first opening and the cap layer within the second openings so that the first openings expose the first dielectric layer and the second openings expose the gate conductive layer of the stack gate structures in the second region to form the second contact openings; and performing a third etching operation to remove the first dielectric layer within the first openings to form the first contact openings.

14. The method of claim 13, wherein the first etching operation, the second etching operation and the third etching operation are all carried out inside the reaction chamber of a processing station.

15. The method of claim 14, wherein material constituting the buffer layer and the cap layer comprises silicon nitride formed using gaseous reactants $CF_4$, $CHF_3$, $O_2$ and Ar.

16. The method of claim 12, wherein the first mask layer further comprises a plurality of third openings within the second region above some of the conductive regions, and the step of removing the second dielectric layer and its underlying buffer layer and cap layer within the first openings and the first dielectric layer within the second openings comprises:

removing the second dielectric layer and its underlying first dielectric layer within the third openings to form the third contact openings.

17. The method of claim 16, wherein the step of forming the first contact openings, the second contact openings and the third contact openings further comprises:

performing a first etching operation to remove the second dielectric layer within the first openings, the second openings and the third openings so that the first openings expose the buffer layer, the second openings expose the cap layers and the third openings expose the first dielectric layer;

performing a second etching operation to remove the buffer layer within the first opening and the cap layer within the second openings so that the first openings expose the first dielectric layer and the second openings expose the gate conductive layer of the stack gate structures in the second region to form the second contact openings; and performing a third etching operation to remove the first dielectric layer within the first openings and the third openings to form the first contact openings and the third contact openings.

18. The method of claim 17, wherein the first etching operation, the second etching operation and the third etching operation are all carried out within the reaction chamber of a processing station.

19. The method of claim 18, wherein material constituting the buffer layer and the cap layers comprises silicon nitride formed using gaseous reactants $CH_4$, $CHF_3$, $O_2$ and Ar.

* * * * *